(12) United States Patent
Engelhardt et al.

(10) Patent No.: US 10,760,565 B2
(45) Date of Patent: Sep. 1, 2020

(54) AIRFLOW GENERATOR

(71) Applicant: GE AVIATION SYSTEMS LLC, Grand Rapids, MI (US)

(72) Inventors: Michel Engelhardt, Woodbury, NY (US); Shushanna Rebecca Cherian-Brutus, Farmingville, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 196 days.

(21) Appl. No.: 15/507,063

(22) PCT Filed: Aug. 27, 2014

(86) PCT No.: PCT/US2014/052974
§ 371 (c)(1),
(2) Date: Feb. 27, 2017

(87) PCT Pub. No.: WO2016/032463
PCT Pub. Date: Mar. 3, 2016

(65) Prior Publication Data
US 2017/0254323 A1 Sep. 7, 2017

(51) Int. Cl.
*F04B 45/047* (2006.01)
*F04B 45/04* (2006.01)
(Continued)

(52) U.S. Cl.
CPC ............ *F04B 45/047* (2013.01); *F04B 45/04* (2013.01); *F04D 33/00* (2013.01); *H05K 7/20172* (2013.01); *H05K 7/20918* (2013.01)

(58) Field of Classification Search
USPC ................ 361/688, 694, 695; 92/48, 49, 50, 92/96–104
See application file for complete search history.

(56) References Cited

U.S. PATENT DOCUMENTS 5,593,290 A * 1/1997 Greisch ................. F04B 19/006
417/478
5,759,015 A * 6/1998 Van Lintel ............ F04B 43/043
417/322
(Continued)

FOREIGN PATENT DOCUMENTS

DE 10 2011 082 063 A1 3/2013
EP 2 693 859 A2 2/2014
EP 2 698 538 A2 * 2/2014 .............. F04B 17/00

OTHER PUBLICATIONS

International Search Report and Written Opinion issued in connection with corresponding PCT Application No. PCT/US2014/052974 dated May 12, 2015.
(Continued)

*Primary Examiner* — Peter J Bertheaud
*Assistant Examiner* — Geoffrey S Lee
(74) *Attorney, Agent, or Firm* — McGarry Bair PC

(57) ABSTRACT

An airflow generator (10) having a first plate (12), a second plate (14) where the second plate (14) is spaced from the first plate (12) to define a cavity (28) there between, a joint (30) operably coupled to the first plate (12) and the second plate (14) and joining them together, piezoelectrics (34) located on each of the first plate (12) and the second plate (14) wherein actuation of the piezoelectrics (34) results in movement of the first plate (12) and the second plate (14) to increase the volume of the cavity (28) to draw air in (200) and then decrease the volume of the cavity (28) to push out the drawn in air (202).

14 Claims, 6 Drawing Sheets

(51) Int. Cl.
 *H05K 7/20* (2006.01)
 *F04D 33/00* (2006.01)

(56) References Cited

U.S. PATENT DOCUMENTS

| | | | | |
|---|---|---|---|---|
| 6,091,182 | A * | 7/2000 | Takeuchi | G02B 26/08 |
| | | | | 310/324 |
| 6,297,578 | B1 * | 10/2001 | Takeuchi | G02B 26/08 |
| | | | | 310/330 |
| 7,553,135 | B2 | 6/2009 | Cho et al. | |
| 2005/0259135 | A1 * | 11/2005 | Mita | B41J 2/14233 |
| | | | | 347/70 |
| 2006/0185822 | A1 | 8/2006 | Glezer et al. | |
| 2006/0227179 | A1 * | 10/2006 | Temple | B41J 2/14201 |
| | | | | 347/68 |
| 2006/0251533 | A1 * | 11/2006 | Nighy | F04B 43/0736 |
| | | | | 417/479 |
| 2010/0228196 | A1 * | 9/2010 | Wyss | A61J 1/1475 |
| | | | | 604/151 |
| 2012/0170216 | A1 | 7/2012 | Arik et al. | |
| 2012/0252221 | A1 * | 10/2012 | De Brabander | B81C 1/00103 |
| | | | | 438/736 |

OTHER PUBLICATIONS

International Preliminary Report on Patentability issued in connection with corresponding PCT Application No. PCT/US2014/052974 dated Mar. 9, 2017.

* cited by examiner

AIRFLOW GENERATOR

BACKGROUND OF THE INVENTION

Contemporary high-power-dissipating electronics produce heat that requires thermal management to maintain the electronics at a designed working temperature range. Heat must be removed from the electronic device to improve reliability and prevent premature failure of the electronics. Cooling techniques may be used to minimize hot spots.

BRIEF DESCRIPTION OF THE INVENTION

In one aspect, an embodiment of the invention relates to an airflow generator including a first and second plate both having a first and second surface where the first surface of second plate is spaced from the first surface of the first plate to define a cavity there between. A joint operably couples to the first and second plates, joining them together, at least one piezoelectric is located on the first and the second plate wherein at least one of the plates include at least one recess that increases the volume of the cavity. The actuation of the piezoelectrics results in movement of the first and second plates to increase the volume of the cavity to draw air in and then decrease the volume of the cavity to push out the drawn in air.

DESCRIPTION OF EMBODIMENTS OF THE INVENTION

Figure 1:
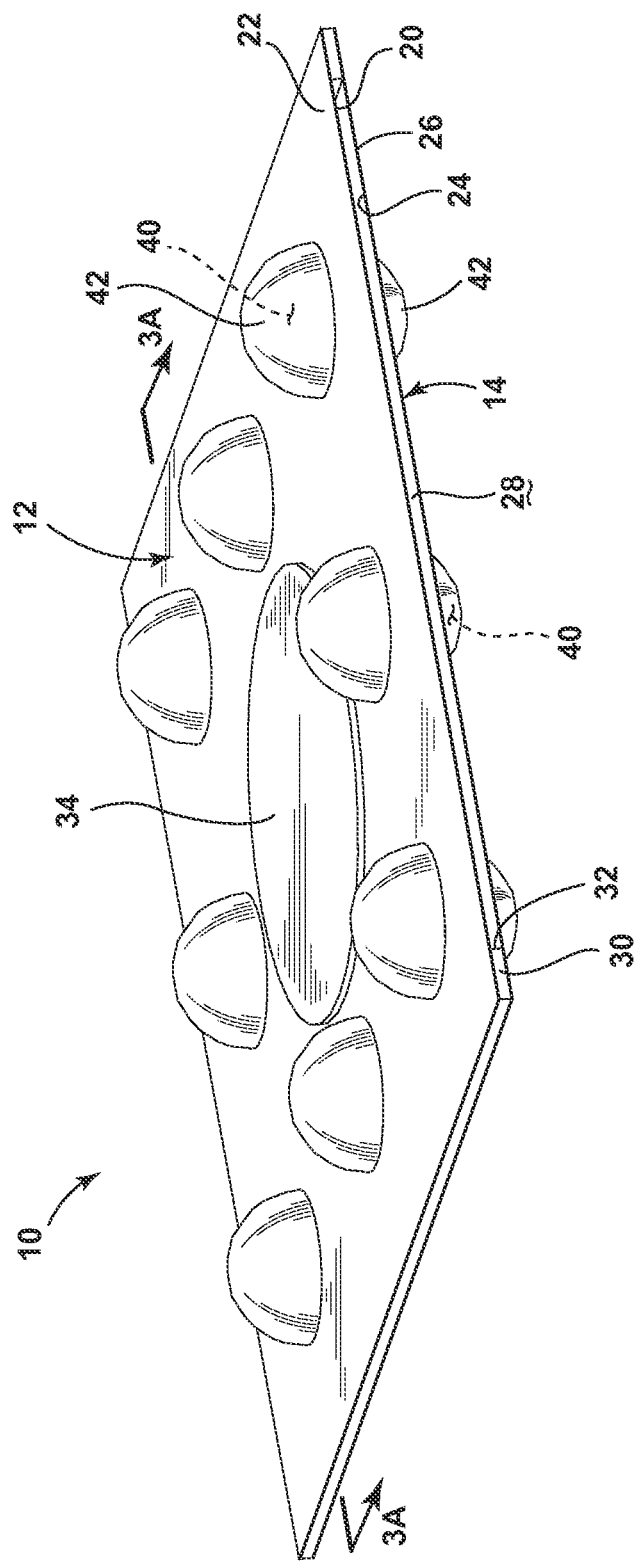
FIG. 1 is a perspective view of an airflow generator according to an embodiment of the invention.

FIG. 1 illustrates an airflow generator 10 having a first plate 12 and a second plate 14 spaced apart from each other and disposed in a generally confronting relationship along their major planes. More specifically, the first plate 12 is illustrated as having a first surface 20 and a second surface 22. The second plate 14 also has a first surface 24 and a second surface 26. The first surface 24 of second plate 14 is spaced from and in a confronting relationship with the first surface 20 of the first plate 12 to define a cavity 28 there between. The first and second plates 12 and 14 may be formed from any suitable flexible material including aluminum, copper, stainless steel, etc.

Figure 2:
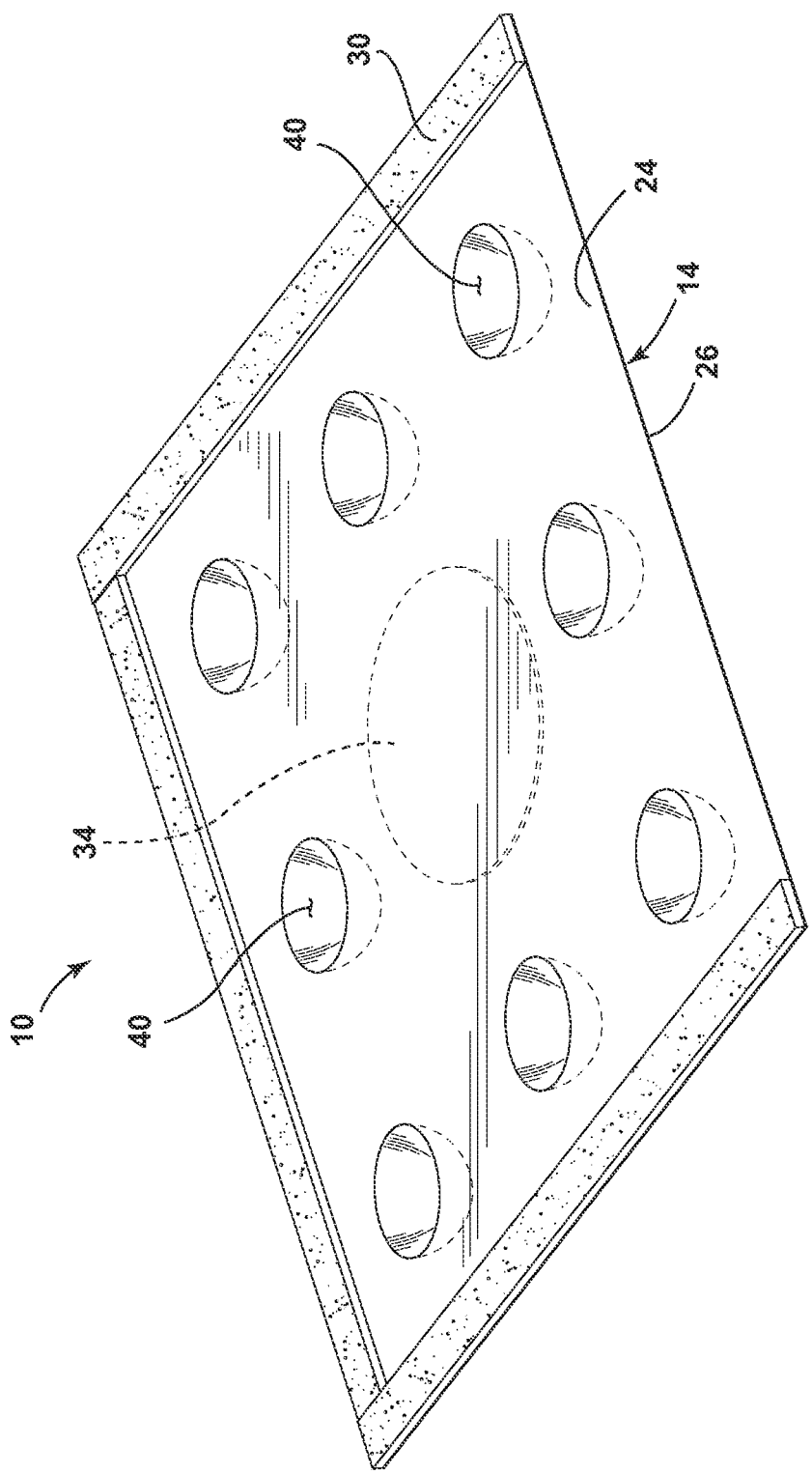
FIG. 2 is a perspective view of the first surface of the second plate of the airflow generator of FIG. 1.

A joint 30 operably couples the first plate 12 and the second plate 14. Any suitable material may be used to form the joint. As illustrated, the suitable material is flexible and airtight. By way of non-limiting example, the joint may be formed of an epoxy. In the exemplary illustration, the first plate 12 and the second plate 14 are square in shape, although it will be understood that this need not be the case, and the joint 30 extends substantially along three sides of the first plate 12 and the second plate 14 (more clearly illustrated in FIG. 2). In this manner, the joint 30 aids in defining the cavity and the portion of the first plate 12 and the second plate 14 not joined by the joint 30 forms an opening 32 to the cavity 28. This arrangement is similar to a bellow.

Figure 5A:
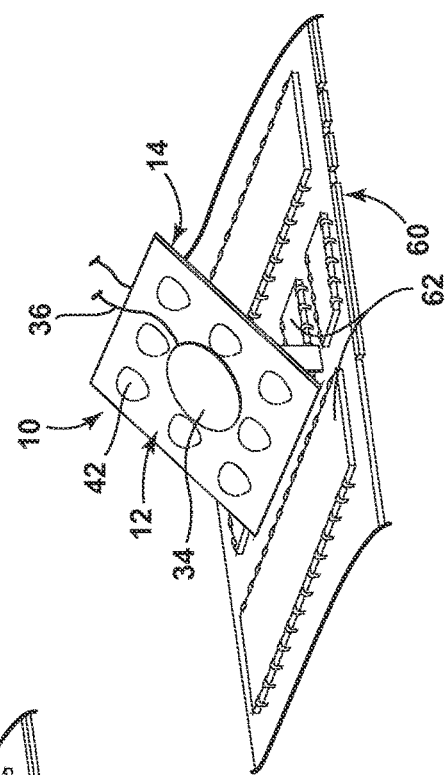
FIGS. 5A-5C are perspective views of the airflow generator of FIG. 1 mounted on an electronic device and with electrical lines attached thereto.
Figure 5B:
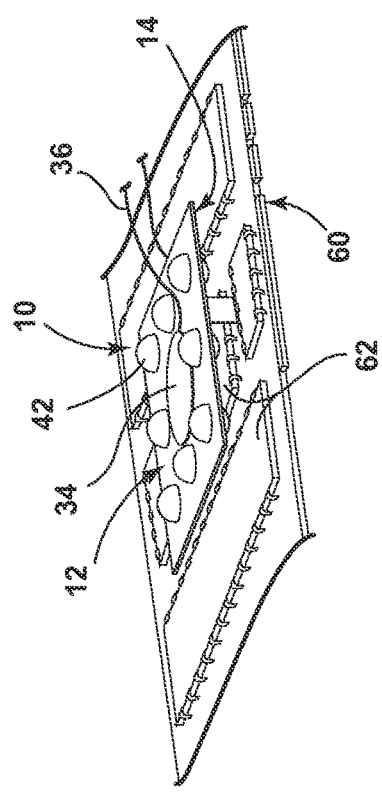
Figure 5C:
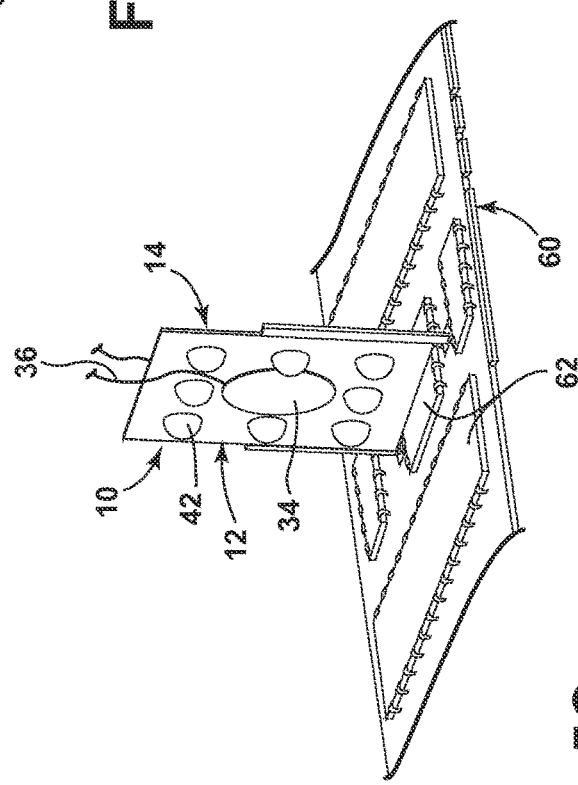

A piezoelectric 34, for example a piezoelectric crystal, may be located on each of the first plate 12 and the second plate 14. In the illustrated example, the piezoelectrics 34 are located at the center of each of the first plate 12 and the second plate 14. While the piezoelectric 34 may be located, elsewhere locating each at the center of its respective plate is believed to increase the deflection of the plate. The piezoelectrics 34 may be operably coupled to suitable power sources through connections 36 (FIGS. 5A-5C).

It is contemplated that either the first plate 12 and/or the second plate 14 may include at least one recess 40 that increases the volume of the cavity 28. In the illustrated embodiment, the first plate 12 and the second plate 14 both have been illustrated as having a plurality of recesses 40 that increase the volume of the cavity 28. Although this need not be the case, the plurality of recesses 40 of the first plate 12 are illustrated as being aligned with the plurality of recesses 40 of the second plate 14. Further, the plurality of recesses 40 of each of the first plate 12 and the second plate 14 are illustrated as surrounding the corresponding piezoelectrics 34.

Figure 3A:
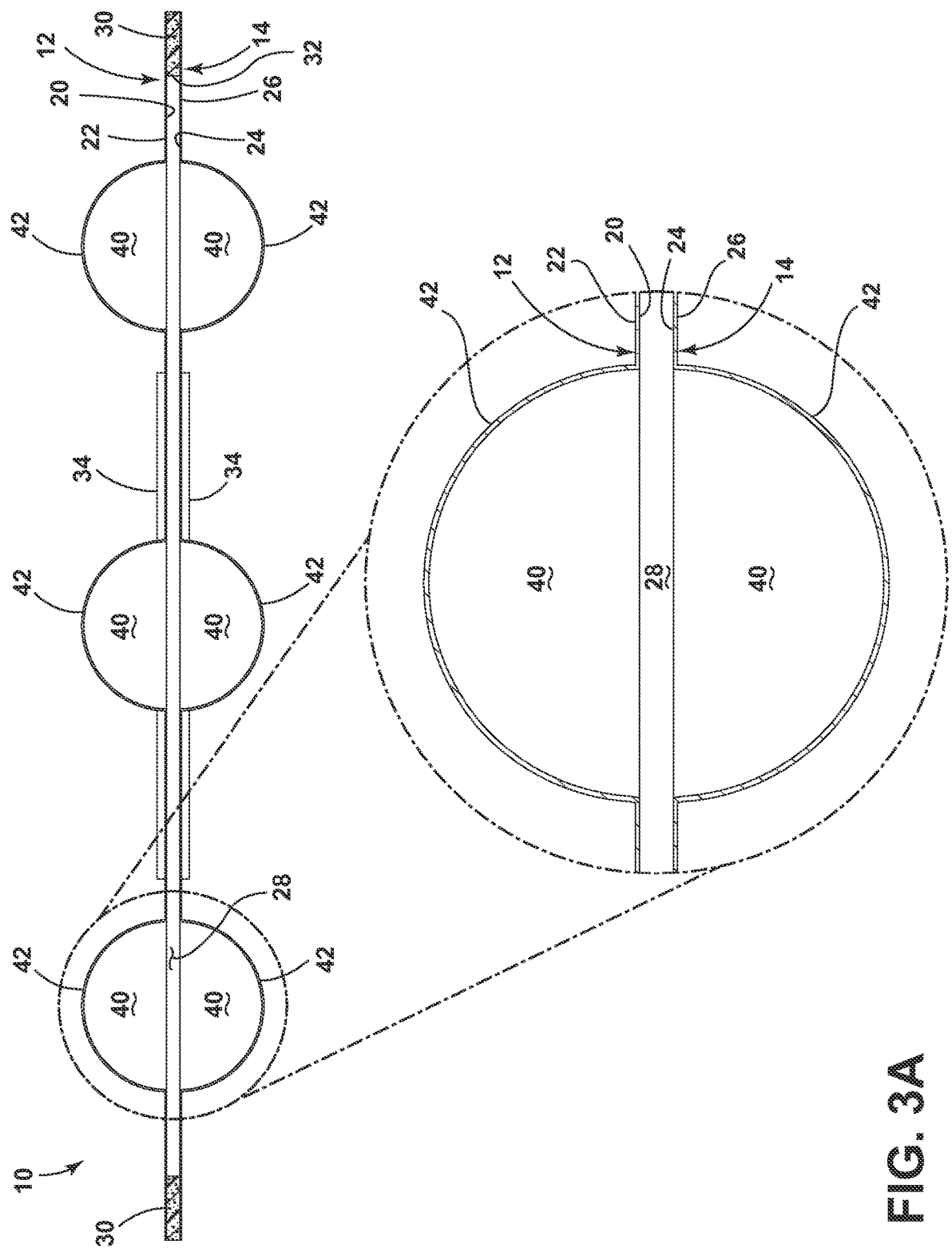
FIG. 3A is a cross-sectional view of the airflow generator of FIG. 1.
Figure 3B:
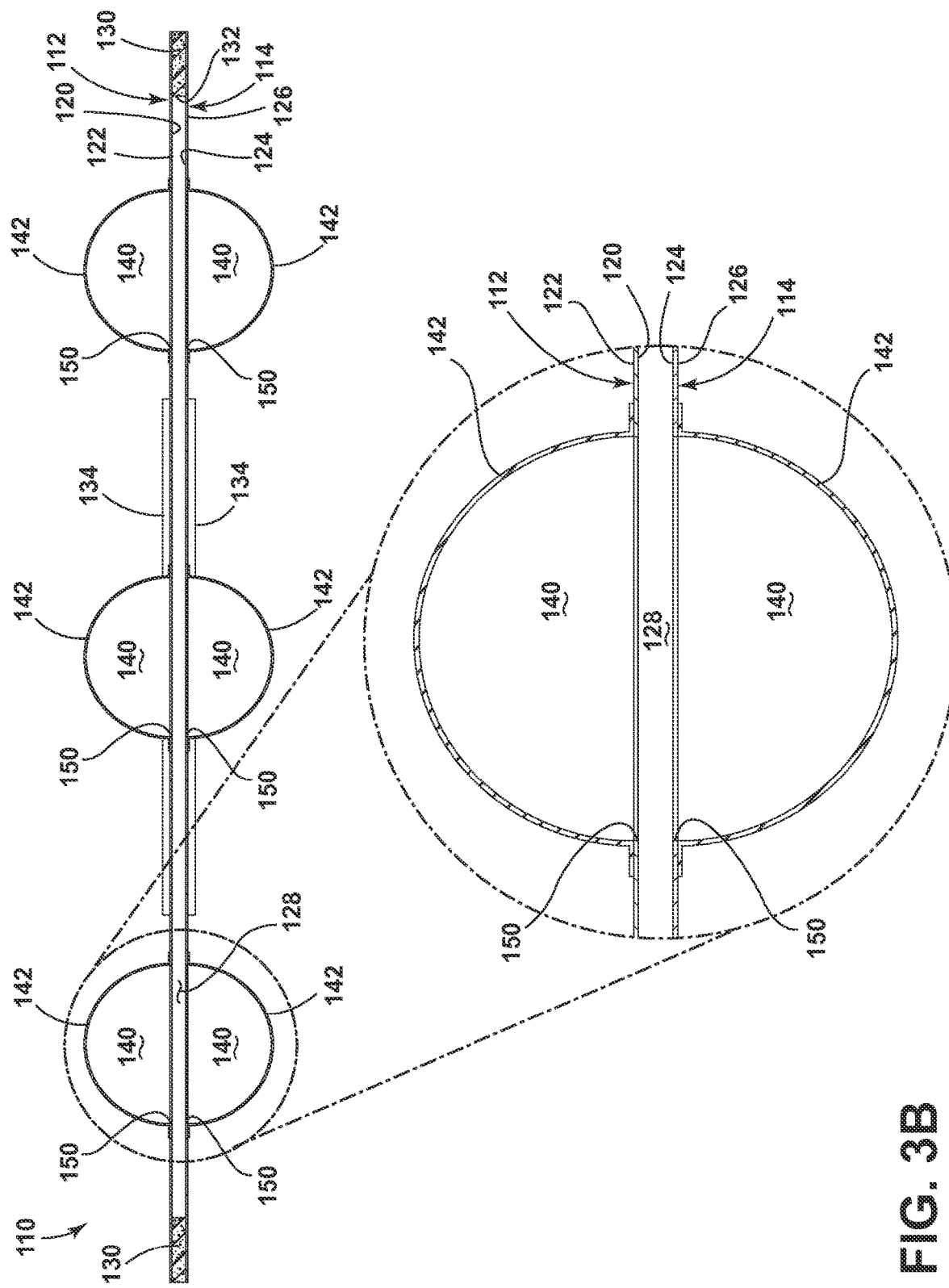
FIG. 3B is a cross-sectional view of an airflow generator according to another embodiment of the invention.

It will be understood that the recess 40 may be shaped in any suitable manner including that the recess 40 may include a dimple 42 extending away from the first surface 20, 24 to form the at least one recess 40. By way of further example, the recesses may include valleys, which may be used to increase the volume of the cavity 28. In the illustrated example, the dimple 42 comprises a circular cross-section but it is contemplated that other shapes may be utilized including elliptical, rectangular, square, etc. Further, the recess may be formed in any suitable manner. As more clearly illustrated in FIG. 3A, the recess 40 may include a depression formed into the first surface 20, 24 of the first and second plates 12, 14, respectively. In this manner, the recess 40 may be formed of the same material as the first and second plate 12, 14. For example, the recess 40 may be stamped, molded, etc. into the first and second plates 12, 14. By way of further non-limiting example, as illustrated in FIG. 3B, another embodiment of the airflow generator 110, much like the airflow generator 10, illustrates that a first plate 112 and/or second plate 114 may include opening(s) 150 extending through the first plate 112 and the second plate 114. For example, such opening(s) 150 may be drilled or cut into the first plate 112 and the second plate 114. In such an instance, the recess 140 may include rubber dimple (s) 142 mounted around the opening(s) 150 to increase the volume of the cavity 128. For example, the rubber dimple(s) may be glued or otherwise attached around each opening 150.

While it will be understood that the recesses 40 may be formed in any suitable manner, for ease of discussion the remainder of this application will reference the exemplary airflow generator 10. During operation, the piezoelectrics 34 are actuated and this results in movement of the first plate 12 and the second plate 14 to increase the volume of the cavity 28 to draw air in and then decrease the volume of the cavity 28 to push out the drawn in air. More specifically, when a voltage is applied through the connections 36 the first plate 12 and the second plate 14 are caused to bend such that they are convex. When a voltage of opposite polarity is applied, the first plate 12 and the second plate 14 bend in the opposite direction (i.e. concave instead of convex). The connections 36 are connected to a controllable electric source (not shown) so that an alternating voltage of the desired magnitude and frequency may be applied to the piezoelectrics 34. The motion of the first and second plates 12, 14 creates a flow of air that may be utilized in cooling components. Because the recesses 40 increase the volume of the cavity 28 an increased airflow may be created.

Figure 4A:
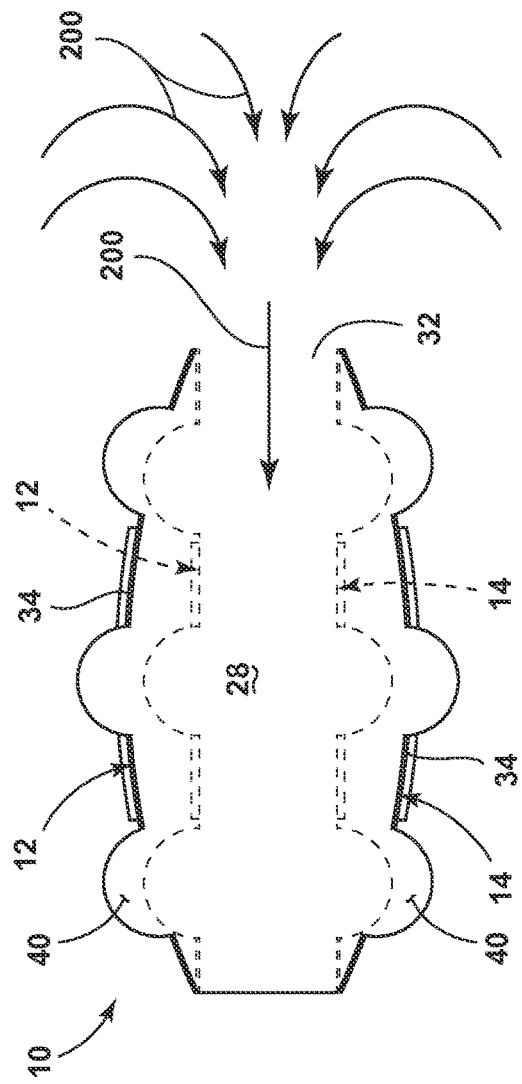
FIGS. 4A and 4B are schematic views illustrating the operation of the airflow generator of FIG. 1.
Figure 4B:
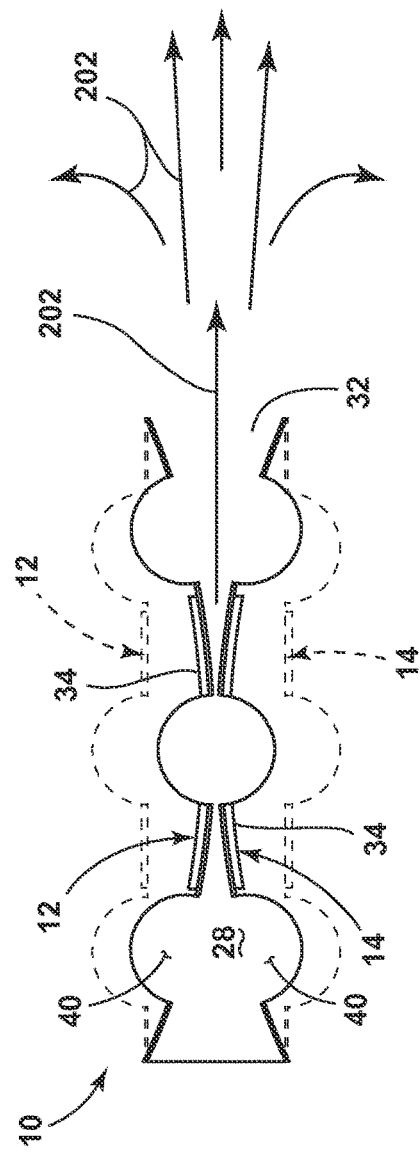

FIGS. 4A and 4B schematically illustrate the movement of the first and second plates 12, 14 of the flow generator 10 during its operation. First, voltage from the electric source is applied to the first and second plates 12, 14 to cause the first and second plates 12, 14 to deflect in opposite directions to each other. That is, when the first plate 12 is deflected convexly upwards, the second plate 14 is deflected convexly downwards. This simultaneous deflection increases the volume of the fluid cavity 28 causes a decreased partial pressure in the cavity 28, which in turn causes air to enter the cavity 28 through the opening 32 as illustrated by the arrows 200. When voltage of opposite polarity is applied, the first and second plates 12, 14 deflect in the opposite direction. This action decreases the volume of the cavity 28 and causes air to be expelled through the opening 32 as illustrated by the arrows 202.

FIGS. 5A-5C illustrate the flow generator 10 mounted to an electronic device 60 in the form of a circuit board having various heat producing components 62. As illustrated, the airflow generator 10 may be oriented in any suitable manner with respect to the electronic device 60 and the heat producing components 62 such that the airflow generator may produce a flow of air that aids in cooling the electronic device 60. The airflow generator 10 may be utilized with any electronic device that requires thermal management for heat dissipation such as electronic components that require a uniform temperature distribution due to thermal sensitivity. For example, the airflow generator 10 may be used with both airborne, shipboard, and ground based electronics.

The embodiments described above provide a variety of benefits including that such airflow generators solve the thermal management problem of cooling electronic devices with high power dissipations, with local hot spots, or electronic components that require a uniform temperature distribution. The airflow generators described above are easy to manufacture, have low electrical draw, are lightweight, and increase component reliability. The above-described embodiments capture a greater volume of air between the plates than an airflow generator without such recesses. The greater volumetric air trapped between the plates result in a greater exiting volumetric airflow from the airflow generator. The higher airflow produces a higher heat transfer coefficient around the hot source that the airflow impinges upon. Compared to contemporary airflow generators, the above-described embodiments allow for approximately twenty percent more air to be trapped between the plates and a twenty percent increase in volumetric airflow exiting the airflow generator. This may result in a ten percent increase in cooling effectiveness due to the larger volumetric airflow exiting from the jet.

To the extent not already described, the different features and structures of the various embodiments may be used in combination with each other as desired. Some features may not be illustrated in all of the embodiments, but may be implemented if desired. Thus, the various features of the different embodiments may be mixed and matched as desired to form new embodiments, whether or not the new embodiments are expressly described. All combinations or permutations of features described herein are covered by this disclosure.

This written description uses examples to disclose the invention, including the best implementation, to enable any person skilled in the art to practice the invention, including making and using the devices or systems described and performing any incorporated methods presented. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An airflow generator, comprising:
a first plate having a first surface and a second surface;
a second plate having a first surface and a second surface wherein the first surface of the second plate is spaced from the first surface of the first plate to define a cavity there between;
a joint operably coupling the first plate and the second plate; and
at least one piezoelectric located on each of the first plate and the second plate;
wherein at least one of the first plate or the second plate includes a plurality of recesses; and
wherein the plurality of recess surround and are spaced from the at least one piezoelectric located on the at least one of the first plate or the second plate, and
wherein at least one recess of the plurality of recesses includes at least one dimple extending away from the at least one of the first plate or the second plate to increase a volume of the cavity.

2. The airflow generator of claim 1 wherein the first plate includes the plurality of recesses that increase the volume of the cavity.

3. The airflow generator of claim 2 wherein the second plate further includes at least one other recess that increase the volume of the cavity.

4. The airflow generator of claim 2 wherein the second plate further a plurality of other recesses that increase the volume of the cavity.

5. The airflow generator of claim 4 wherein the plurality of recesses of the first plate are aligned with the plurality of other recesses of the second plate.

6. The airflow generator of claim 4 wherein the at least one piezoelectric comprises a first piezoelectric and a second piezoelectric and the first piezoelectric is located at a center of the first plate and the second piezoelectric is located at a center of the second plate.

7. The airflow generator of claim 6 wherein the plurality of recesses of the first plate extend around the first piezoelectric and the plurality of other recesses of the second plate extend around the second piezoelectric.

8. The airflow generator of claim 1, wherein the t one dimple includes a circular cross-section.

9. The airflow generator of claim 1 wherein the plurality of recesses comprises depressions formed into the first surface.

10. The airflow generator of claim 1 wherein the first plate or the second plate comprises openings extending through the first plate or the second plate.

11. The airflow generator of claim 10 wherein the plurality of
recesses comprises a plurality of rubber dimple mounted around the corresponding openings to increase the volume of the cavity.

12. The airflow generator of claim 1 wherein the joint comprises an epoxy.

13. The airflow generator of claim 1 wherein the first plate and the second plate are square in shape and the joint extend along three sides of the first plate and the second plate.

14. The airflow generator of claim 13 wherein a portion of the first plate and the second plate not joined by the joint forms an opening to the cavity.

\* \* \* \* \*